United States Patent [19]

Howard et al.

[11] 4,326,911
[45] Apr. 27, 1982

[54] REACTIVE ION ETCHING OF III-V COMPOUNDS INCLUDING INP, GAAS-INP AND GAALAS

[75] Inventors: Richard E. Howard, Holmdel; Evelyn L. Hu, Somerset, both of N.J.

[73] Assignee: Bell Telephone Laboratories, Incorporated, Murray Hill, N.J.

[21] Appl. No.: 212,976

[22] Filed: Dec. 4, 1980

Related U.S. Application Data

[63] Continuation-in-part of Ser. No. 116,540, Jan. 29, 1980, abandoned.

[51] Int. Cl.$^3$ .......................................... H01L 21/306
[52] U.S. Cl. .................................... 156/643; 156/646; 156/655; 156/662; 204/192 E; 252/79.1
[58] Field of Search ............... 156/643, 657, 662, 646, 156/655; 204/192 E; 252/79.1

[56] References Cited

U.S. PATENT DOCUMENTS 3,971,684  7/1976  Muto ................................... 156/643
4,028,155  6/1977  Jacob .................................. 252/79.1

OTHER PUBLICATIONS

Howard et al., "Reactive Ion Etching..." Conference: Integrated and Guided-Wave Optics Technical Digest, Incline Village, NV, (28-30 Jan. 1980).
Burstell et al., "Preferential Etch ... GaAlAs", IBM Technical Disclosure Bulletin, vol. 20, No. 6 (11/77), p. 2451.
Iga et al., "GaInAs/P ... Etching", Topical Meeting on Integrated and Guided Wave Optics (IEEE, New York) presented Jan. 28-30, 1980, Incline Village, Nevada.
Smolinsky et al., "Plasma Etching of III-V ... Oxides", presented by R. Chang, Amer. Vac. Soc. Meeting, New York, N.Y., Oct. 29, 1979.
Somekh et al., "Dry Processing ... Optics", Applied Optics, vol. 16, No. 1 (1-77), pp. 126-136.
Todokoro et al., "Selective ... Plasma Process", Matsushita Elec. Co., Memorandum UA-E-6 (1979), pp. 1-3.

Primary Examiner—Jerome W. Massie
Attorney, Agent, or Firm—Michael B. Einschlag; David R. Padnes

[57]     ABSTRACT

The successful application of the reactive ion etching technique to the III-V compounds requires the use of the appropriate etch gas. We have found that a gas mixture comprised of either $CCl_2F_2$ alone or in combination with one or more of the gasses: argon (Ar), oxygen ($O_2$) and nitrogen ($N_2$) will cleanly and effectively etch GaAs and InP and their ternary and quaternary alloys as well as AlGaAs and the oxides of GaAs. The effective ranges of relative flow rates of Ar, $CCl_2F_2$ and oxygen are: Ar (0-83%), $CCl_2F_2$ (8-100%), $O_2$ (0-50%), and $N_2$ (0-60%).

11 Claims, 5 Drawing Figures

REACTIVE ION ETCHING OF III-V COMPOUNDS INCLUDING INP, GAAS-INP AND GAALAS

BACKGROUND OF THE INVENTION

This application is a continuation-in-part of application Ser. No. 116,540 filed on Jan. 29, 1980, now abandoned.

This invention relates to the processing of semiconductor materials and, more particularly, to a process for reactive ion etching.

III-V semiconductors and their derivative ternary and quaternary compounds are of interest for the fabrication of both high speed switching devices and optoelectronic elements such as lasers and detectors. The necessity for efficient light coupling, confinement and/or transmission puts stringent requirements on the resolution of the pattern transfer technique and on the edge smoothness of the structures formed. Integration of these devices into compact circuits combining high speed electrical and optical processing requires the development of a fabrication technology comparable to that used for silicon integrated circuits.

Preferential chemical etching has been widely used to provide the requisite smooth walls, but patterning III-V compounds in this way requires the precise orientation of the crystalline substrates and thus limits device design possibilities. Gratings selectively etched into GaAs have shown slight sidewall modulation attributed in part to misalignment between the grating direction as defined by the mask, and the cleavage planes, see, for example, an article entitled "Selectively Etched Diffraction Gratings in GaAs", *Applied Physics Letters*, Vol. 25, No. 4, Aug. 15, 1974, pp. 208–210 by K. Comerford and P. Tory. Variation in the depths of preferentially etched channel waveguides according to the initial stripe width in the defining mask has been reported in an article entitled "Optical Waveguides Fabricated by Preferential Etching", *Applied Optics*, Vol. 14, No. 5, May 1975, pp. 1200–1206 by W. T. Tsang, C. C. Tseng, and S. Wang.

Optical gratings have also been produced by ionbeam milling substrates through photoresist masks. Limitations of this technique are possible faceting of the substrate, redeposition of sputtered material (hence alteration of etched profiles) and enhancement of lattice defects, see Tsang et al referred to hereinabove and an article entitled "Profile Control by Reactive Ion Sputter Etching" *J. Vac. Sci. Technol.*, 15 (2), March/April 1978, pp. 319–326 by H. W. Lehmann and R. Widmer.

Reactive ion etching has been used to transfer high resolution sub-micron patterns into Si, $SiO_2$, and $Si_3N_4$ substrates. One example of this is the patterning of square wave gratings 250 Å deep with 3200 Å periodicity into $SiO_2$ see, for example, an article entitled "Alignment of Liquid Crystals Using Submicrometer Periodicity Gratings", *Applied Physics Letters*, Vol. 32, No. 10, May 15, 1978, pp. 597–598 by D. C. Flanders, D. C. Shaver and H. I. Smith. The utility of this technique for the fabrication of component devices for integrated optics is manifest, however, efforts to reactively ion etch III-V compounds have thus far met with limited success, see, for example, an article entitled "A Survey of Plasma-Etching Processes", *Solid State Technology*, 19 (5), May 1976, pp. 31–36, by R. L. Bersin.

SUMMARY OF THE INVENTION

We have developed a process for using reactive ion etching to pattern GaAs, InP, GaAlAs and their derivative compounds, including oxides of GaAs. Because reactive ion etching is a high resolution pattern-transfer technique it should be of great utility in the fabrication of optical gratings for use in (e.g.) couplers, DFB lasers, Bragg reflectors, waveguides and laser structures.

The successful etching of GaAlAs, GaAs and InP also encompasses ternary and quaternary compounds of these materials and thus makes a wide range of integrated optics structures amenable to this technique. Moreover, the anisotropy of the etching obviates constraints placed on the device design by the crystalline substrate orientation.

The successful application of the reactive ion etching technique to the III-V compounds and their oxides requires the use of an appropriate etch gas. The product compounds of that gas with the substrate material should be sufficiently volatile that they neither impede the etch rate, nor reduce the fidelity of the pattern transfer. We have found that a gas mixture of $CCl_2F_2$ (commonly sold under the trademark name FREON 12) alone or in combination with gases chosen from, argon (Ar), oxygen ($O_2$) and nitrogen ($N_2$) will cleanly and effectively etch GaAs and InP, ternary and quaternary compounds of these materials, GaAlAs and the oxides of GaAs. The best ranges of relative flow rates of Ar, $CCl_2F_2$, $O_2$ and $N_2$ were: Ar (0–83%), $CCl_2F_2$ (8–100%), $O_2$ (0–50%), and $N_2$ (0–60%).

BRIEF DESCRIPTION OF THE DRAWING

A complete understanding of the present invention may be gained from a consideration of the detailed description presented hereinabove in connection with the accompanying drawings in which.

DETAILED DESCRIPTION

Figure 1:
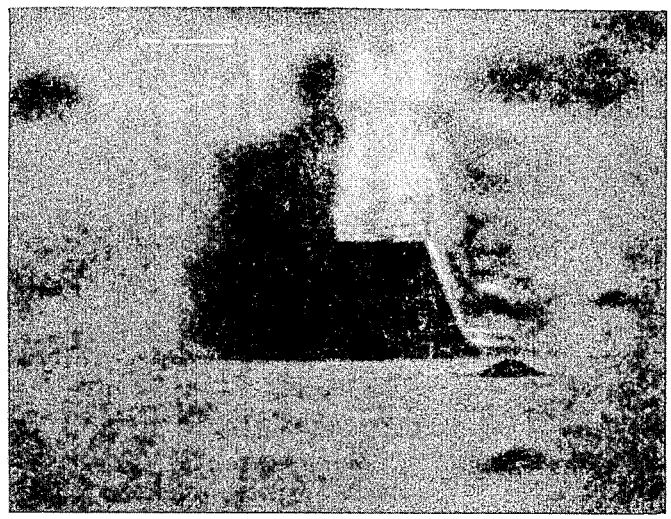
FIGS. 1–2 show pictures of applications of the process to etch an InP <100> sample.

The following describes, in accordance with the present invention, a process for reactive ion etching of GaAs, InP and their derivative ternary and quarternary compounds, GaAlAs and the oxides of GaAs.

The etch gas used is $CCl_2F_2$ alone or in combination with gases chosen from argon (Ar), oxygen ($O_2$) and nitrogen ($N_2$). The ranges of relative flow rates of Ar, $CCl_2F_2$, $O_2$ and $N_2$ which cover the process are: Ar (0–83%), $CCl_2F_2$ (8–100%), $O_2$ (0–50%), and $N_2$ (0–60%).

We have found that $CCl_2F_2$ supplies the chemically reactive etching species in the gas mixture. The addition of oxygen promotes the rate of etching, probably by reacting with unsaturated halocarbons to prevent their recombination with the active etching species. Generally, increasing the $O_2$ content increases the etch rate, provided that the percentage of $CCl_2F_2$ is not overly diluted. The addition of argon appears to contribute in an active way to the etching process; use of the same amount of He, rather than Ar, all other parameters being equal, results in a reduced etch rate. However, the etch rate does not appear to be a strong function of the percentage of Ar in the gas mixture. Keeping the ratio of $CCl_2F_2/O_2$ constant and changing only the relative abundance of that ratio to Ar, we have observed an increase in etch rate with increasing $CCl_2F_2$, for the ratio of $CCl_2F_2/Ar=0.1$ to $CCl_2F_2/Ar=1$.

This reactive ion etching process has been developed using two conventional diode sputtering systems with pyrex chambers. The first (MRC) is a MRC Corp. model SEM 8620 and the second (CV) is a Cooke Vacuum Corp. model C 71-3. Both systems have a conventional oil diffusion pump and a liquid nitrogen ($LN_2$) cold trap. In addition, the CV has an optically dense water cooled baffle, which baffle was used for all of the runs on that station.

In both systems, the plasma was generated by a 13.56 MHz rf generator connected to two parallel, water-cooled electrodes 5" in diameter. The rf matching network on the sputtering system was tuned to supply most of the power to the electrode on which the samples to be etched were placed. For MRC, some small amount of power (25 percent or less as measured by the developed dc voltages on the electrodes) was also applied to the other electrode because of the limitations of the matching network. In both systems, the electrode on which the samples were etched was covered with a silicon wafer, which wafer was coupled with high thermal conductivity to the water-cooled electrode; the other electrode was fused quartz.

The flow of the reactive gasses through the sputtering systems was controlled using both pressure and flow-ratio servo systems. A MKS model 170 capacitance manometer was used to monitor the pressure. The signal from this manometer was used by a Vacuum General Corp. model 77-1 pressure controller to adjust the flow of a first gas through a model PV-10 valve. (This may be designated as the main gas). The flow of two other gasses could be controlled by a Vacuum General Corp. model 77-4 flow/ratio controller. The system provided that either the flow of a secondary gas or the ratio of its flow to the main gas flow could be held constant. The flow rate of all the gasses was monitored using Tyland Corp. model FM 360 thermal mass flowmeters. A main and a secondary gas were measured using 100 standard cubic centimeter per minute (sccm) full scale meters and a tertiary gas was monitored using either a 10 sccm or 100 sccm full scale meter. In both stations, the gasses were mixed in an external manifold before entering the station. For CV, the manifold was heated to reduce adsorption of gasses on the walls. For certain etch runs the $LN_2$ trap was utilized. Because of differential cryopumping of the plasma constituents the chemical composition of the plasma is dependent upon whether or not the $LN_2$ trap is used. In particular, $CCl_2F_2$ is pumped much faster than $O_2$ or Ar when the trap is cold. This results in a smaller relative proportion of the latter constituents for a given flow ratio when the trap is cold.

Substrates were patterned by lift-off techniques: the metal masks used were usually 500 Å of Ni-Cr atop 50 Å of Cr (the Cr was used to promote the film adhesion to the substrate). Other masking materials may be chosen and we have also used Mg, Al and Cr as masks. Masking material may be designated as being either "erodible", i.e., able to be chemically etched by the reactive gas, or "nonerodible". The latter materials will be physically sputtered by the reactive ions; the sputtered material may subsequently redeposit onto the substrate surface, thus acting as a widely distributed, highly porous mask. There are some general trends which have been observed which will dictate the choice of masking material. Mg is a nonerodible mask and is useful for very deep etching in both InP and GaAs. The surface roughness of the etched regions due to redeposition of sputtered mask can be quite severe and limits the usefulness of the substrate. In addition, the poor adhesion and large grain size of Mg films make the fabrication of high resolution masks difficult. Both Cr and Ni-Cr appear to be good masks in that roughness due to redeposition of sputtered mask material is minimal. In addition, Ni-Cr films have grain sizes well below 1000 Å, allowing the production of high resolution masks. The difficulty with these materials is that the evaporated films have considerable strain and thick films (necessary to etch more than about $2\mu$ deep) are difficult to form. Films deposited by another technique (such as multi-layer evaporation or plating) would be necessary for deep etches. Another disadvantage of these materials could be in the need to remove them for subsequent processing. It would be necessary to develop appropriate chemical or plasma etches compatible with the particular process of interest. Another possible solution is to deposit a separation layer before depositing the mask. The separation layer could be removed using an appropriate etch or solvent which would not attack the substrate.

In the variation of etch parameters, we were particularly observant of the following: absolute substrate etch rate; differential etch rate of the substrate material with respect to the masking material; the morphology of the substrate floor; and the slope of the etched walls with respect to the plane of the substrate.

In using the process in accordance with the present invention, particular combinations of etch pressure, rf power, and gas composition may be chosen to optimize a particular feature, often at the expense of other features. For example, etching at high power densities can yield rapid etch rates and nearly vertical walls in the substrate; however, the floor of the substrate may be irregular because of either (1) random masking by redeposited materials during the etch process, or (2) the actual presence of redeposited material on the surface. However, it may be most important to obtain a deep, highly vertical etch of the sample, with the irregularity of the floor being tolerable. Similarly, it might be desirable for certain applications that the floor of the substrate be smooth, while the etch depth need not be large.

We have etched at forward powers ranging from 25 to 200 W, usually operating at 70 or 100 W. Total etch gas pressures ranging from $1\mu$ to $40\mu$ have been used. We note several general trends of the etch results as a function of pressure. Because of physical sputtering and possible enhanced chemical effects, the etching rate of the masking material increases with decreasing pressure in the range from $1\mu$ to $40\mu$. Since the etch rate of InP decreases at the higher pressures under the conditions which have been studied, and GaAs appears to have the opposite behavior, the choice of the optimum pressure will depend upon the choice of sample. The verticality of the etched walls also depends upon the etching pressure. In all the conditions studied to date, the etched profile shows a "negative undercut", that is the profile slopes away from the masked region rather than going beneath the mask, as is usual in wet chemical etching. In InP, the verticality of these walls is best at low pressure (less than 10μ) while in GaAs it is good over a wide pressure range as high as 20μ. Depending upon gas composition and purity of the sample, the etched surface may show an extreme columnar morphology. Though these needle-like columns can be removed by postprocessing with chemical and mechanical techniques, their formation will limit the usefulness of etching in this regime.

EXAMPLE 1

An InP <100> sample, patterned with a metallic mask composed of 50 Å Cr, 1050 Å Ni-Cr, was placed on a Si plate of the rf-powered electrode in CV. The liquid nitrogen trap was filled. After the chamber was pumped down to <1μ chamber pressure, oxygen was flowed through the system at a rate of 30 sccm to a pressure of 13μ. Approximately 25 W was applied for 2 minutes to clean the substrate of any organic scum present. The oxygen was then pumped out and a gaseous mixture having equal flow rates of Ar, $CCl_2F_2$ and $O_2$ was introduced. Total system pressure was 5μ and the total flow-rate was approximately 14 sccm. The applied power was 70 W and the powered electrode was self-biassed at 500 V. The other electrode was self-biased at 150 volts. The total etch time of 17 minutes was the time required to just etch through the Ni-Cr mask, as determined by the clearing of a glass slide patterned with the same amount of Ni-Cr as used to mask the InP, and etched simultaneously with it. The picture is shown in FIG. 1. In FIG. 1 the long horizontal white line corresponds to 1μ. The total etch depth is approximately 2μ, yielding an etch rate of approximately 0.12μ/minute. The walls are inclined at an angle of approximately 70 degrees with respect to the plane of the substrate floor.

EXAMPLE 2

Figure 2:
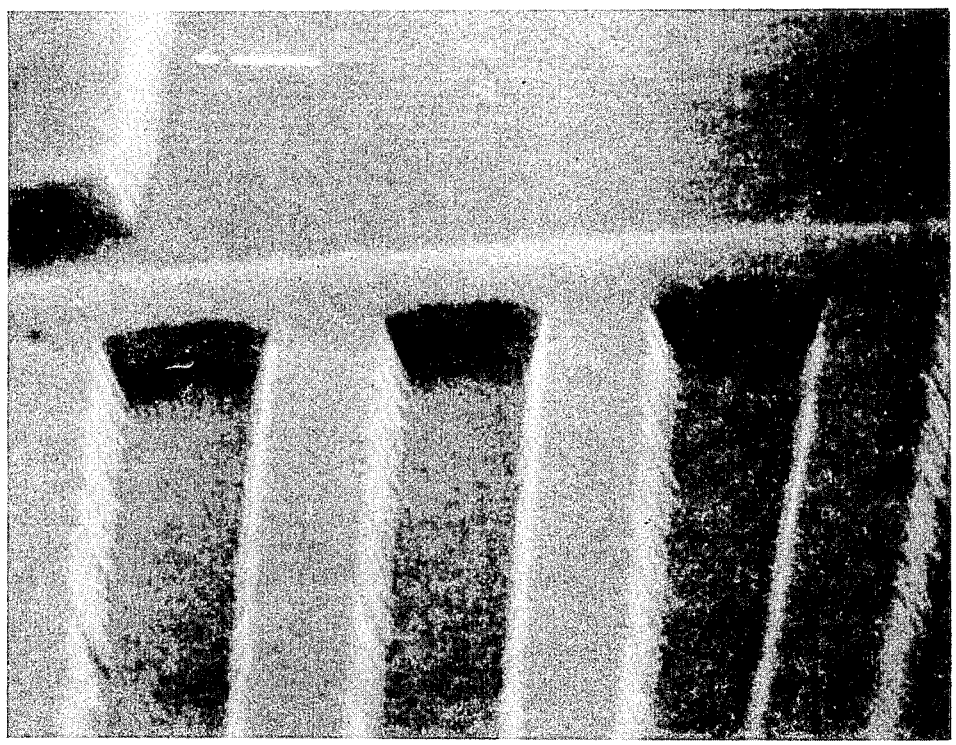
Figure 4:
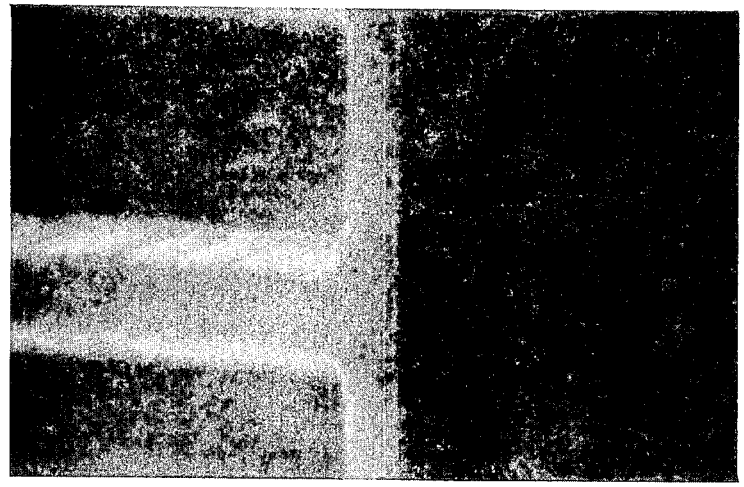
FIG. 4 shows an enlargement of a section of FIG. 3 contained within the white rectangle.
Figure 3:
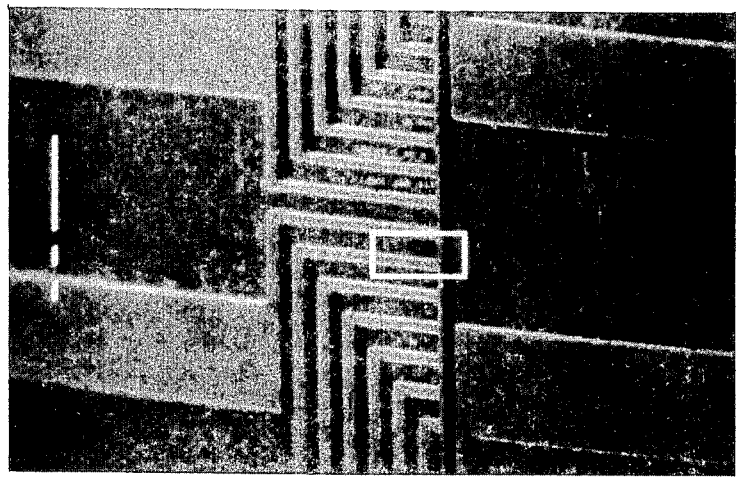
FIG. 3 shows a picture of an application of the process to etch GaAs <100>.
Figure 5:
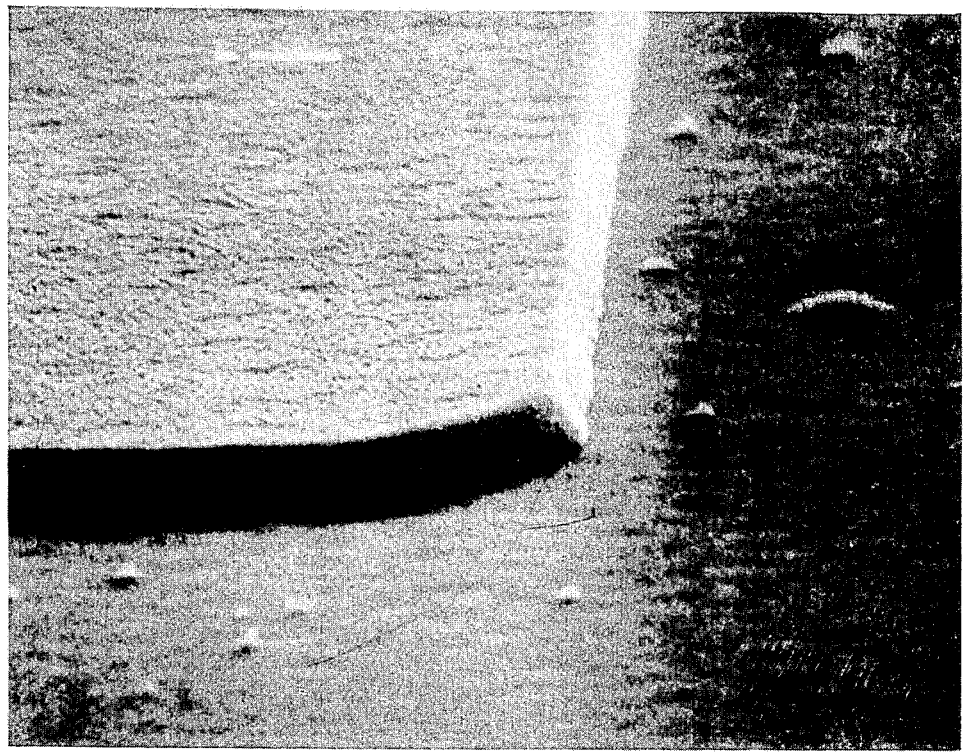
FIG. 5 shows a picture of an application of the process to etch InGaAsP/InP.

InP <100>, GaAs <100>, and InGaAsP/InP were patterned with Cr masks 450 Å thick. The substrates were placed on the powered electrode of the MRC station, as was a glass slide coated with 450 Å of Cr. $CCl_2F_2$ was flowed through the chamber at 7 sccm, yielding a pressure of 1μ. The $LN_2$ trap was cooled. Total gas pressure was 5μ. The remaining 4μ of gas was composed of Ar/10% $O_2$ with an Ar flow rate of 40 sccm and an $O_2$ flow rate of 4 sccm. 75 W of forward power was applied with a bias voltage of 800 V on the sample electrode and 300 V on the other electrode. The total etch time was 6.5 minutes (the time required for the film on the glass slide to clear), resulting in etch depths of InP, GaAs and the quaternary of 0.83, 0.52 and 0.62μ. FIGS. 2 and 3 show pictures of the results of the etch process as applied to InP and GaAs. FIG. 4 is an enlargement of the section of FIG. 3 enclosed by the white rectangle. FIG. 5 shows a picture of the results of the etch process as applied to InGaAsP/InP.

EXAMPLE 3

A multilayer sample having a total thickness of 3.7 μm, grown using MBE atop a GaAs substrate, and comprising alternating layers of GaAs, 195 angstroms thick, and $Ga_{0.7}Al_{0.3}As$, 210 angstroms thick was etched in $CCl_2F_2$ alone at 5 microns of pressure for 13 minutes in the CV using the $LN_2$ trap. The sample was masked with Ni-Cr. A similar sample was etched in $CCl_2F_2$ and 20 percent (relative flow) $N_2$ at 5 microns of pressure for 10 minutes. Although the second process gave less degradation of the Ni-Cr mask than the first process, both samples showed clean etches with etch rates comparable to GaAs alone. We have also etched similar multilayer samples with $CCl_2F_2$ and 60 percent (relative flow) Ar at 3 microns for 15 minutes. The presence of Ar seemed more crisply to define the profile edge of the etched sample and "break up" the globules which nucleate on the mask area. Lastly, a similar sample was etched in $CCl_2F_2$, $O_2$ and Ar with relative flow rates of 1:1:1. Thus we have used these chemical constituents to etch GaAs as well as GaAlAs.

EXAMPLE 4

As sample containing the oxides of GaAs was etched with $CCl_2F_2$ alone at a pressure of 4.7 μm and 30 W on the sample electrode for 10 minutes in the CV with the $LN_2$ trap. The same was etched at the same rate as GaAs.

What is claimed is:

1. A process for reactive-ion-etching a III-V semiconductor substrate made of one or more compounds selected from the set of InP, GaAs-InP alloys and GaAlAs in which a plasma is ignited in a gas disposed between two electrodes, and said substrate is placed on the cathode electrode to which rf power is applied characterized in that
said gas comprises $CCl_2F_2$.

2. The process as defined in claim 1 wherein said gas further includes oxygen.

3. The process as defined in claim 1 wherein said gas further includes nitrogen.

4. The process as defined in claim 1 wherein said gas further includes argon.

5. The process as defined in claim 2 wherein said gas further includes argon.

6. The process as defined in claim 3 wherein said gas further includes argon.

7. The process as defined in claim 1 wherein said gas further includes helium.

8. The process as defined in claim 2 wherein said gas further includes helium.

9. The process as defined in claim 3 wherein said gas further includes helium.

10. A process for reactive-ion-etching a III-V semiconductor substrate made of one or more compounds selected from the set of InP, GaAs-InP alloys and GaAlAs in which a plasma is ignited in a gas disposed between two electrodes and said substrate is placed on the cathode electrode to which rf power is applied characterized in that
said gas comprises one or more components selected from the group comprising $CCl_2F_2$, Ar and $O_2$ and wherein $CCl_2F_2$ has a relative flow rate of 8–100 percent, Ar has a relative flow rate of 0–83 percent and $O_2$ has a relative flow rate of 0–50 percent.

11. A process for reactive-ion-etching a III-V semiconductor substrate made of one or more compounds selected from the set of InP, GaAs-InP alloys and GaAlAs in which a plasma is ignited in a gas disposed between two electrodes, and said substrate is placed on the cathode electrode to which rf power is applied characterized in that
said gas comprises one or more components selected from the group comprising $CCl_2F_2$ and $N_2$ wherein the relative flow rate of $N_2$ is 0–60 percent.

* * * * *